United States Patent
Chiu et al.

(10) Patent No.: US 7,109,574 B2
(45) Date of Patent: Sep. 19, 2006

(54) INTEGRATED CIRCUIT PACKAGE WITH EXPOSED DIE SURFACES AND AUXILIARY ATTACHMENT

(75) Inventors: Anthony M. Chiu, Richardson, TX (US); Harry Michael Siegel, Hurst, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 10 days.

(21) Appl. No.: 10/400,207

(22) Filed: Mar. 27, 2003

(65) Prior Publication Data

US 2004/0017000 A1   Jan. 29, 2004

Related U.S. Application Data

(63) Continuation-in-part of application No. 10/206,641, filed on Jul. 26, 2002, now Pat. No. 6,700,190.

(51) Int. Cl.
*H01L 23/06* (2006.01)
*H01L 23/50* (2006.01)
*H01L 29/40* (2006.01)

(52) U.S. Cl. .................. 257/684; 257/780; 257/781; 257/782; 257/784; 257/787; 257/693

(58) Field of Classification Search ............... 257/693, 257/684, 787, 780–782, 784, 675, 685, 706, 257/48
See application file for complete search history.

(56) References Cited

U.S. PATENT DOCUMENTS

| | | | |
|---|---|---|---|
| 6,242,932 B1 * | 6/2001 | Hembree | 324/755 |
| 6,429,530 B1 * | 8/2002 | Chen | 257/778 |
| 6,534,859 B1 * | 3/2003 | Shim et al. | 257/706 |
| 6,630,371 B1 * | 10/2003 | Hembree | 438/118 |
| 6,661,103 B1 * | 12/2003 | Akram | 257/787 |

* cited by examiner

*Primary Examiner*—Jasmine Clark
(74) *Attorney, Agent, or Firm*—Lisa K. Jorgenson; William A. Munck

(57) ABSTRACT

An integrated circuit (IC) device comprising: 1) an integrated circuit (IC) die having a first surface, a second surface opposite the first surface, and sidewalls extending between the first surface and the second surface; 2) an integrated circuit (IC) package for supporting the IC die, wherein the IC package is attached to at least one of the sidewalls of the IC die such that at least a portion of the IC die first surface and at least a portion of the IC die second surface are exposed; and 3) at least one auxiliary component attached to at least one of the exposed portion of the IC die first surface and the exposed portion of the IC die second surface.

30 Claims, 5 Drawing Sheets

INTEGRATED CIRCUIT PACKAGE WITH EXPOSED DIE SURFACES AND AUXILIARY ATTACHMENT

CROSS-REFERENCE TO RELATED APPLICATION

This application is a continuation-in-part (CIP) of U.S. patent application Ser. No. 10/206,641, filed on Jul. 26, 2002 U.S. Pat. No. 6,700,190 and entitled "INTEGRATED CIRCUIT DEVICE WITH EXPOSED UPPER AND LOWER DIE SURFACES". The disclosure of related patent application Ser. No. 10/206,641 is hereby incorporated by reference into the present disclosure as if fully set forth herein.

TECHNICAL FIELD OF THE INVENTION

The present invention is generally directed to integrated circuit (IC) packages and, more specifically, to an IC device having exposed upper and lower IC die surfaces and an auxiliary attachment mounted on one or both of the upper and lower IC die surfaces.

BACKGROUND OF THE INVENTION

The size of integrated circuit (IC) packages continues to decrease even as the complexity and level of circuit integration in the IC packages continue to increase. This is particularly true in the case of system-on-a-chip (SOC) devices, in which most, if not all, of an electronic appliance is integrated onto a single integrated circuit die. Thus, relatively complex devices, such as cell phones, network interface cards (NICs), communication buses, and the like, are now being implemented as a single integrated circuit or perhaps only several integrated circuits.

Many integrated circuit (IC) devices do not encapsulate the entire IC chip in a protective package. For example, an IC sensor chip used in a fingerprint reader is a Touch-chip™ device (produced by STMicroelectronics, Inc.) that uses a sensor array to is read a fingerprint. In order to work properly, the sensor array must be at least partially exposed in order to receive the finger of a user. Other types of IC packages that expose the surface of the integrated circuit are chemical and pressure sensors. Optical sensors may be covered by a lens element. Light sensitive elements on the surface of the IC die are left exposed in order to detect light. More generally, it is useful in many applications to leave at least a portion of the surface of an IC die exposed so that test points on the IC die may be probed. Alternatively, it may be useful to leave a portion of the IC die surface exposed so that an end-user of the IC device may incorporate the IC package into a larger system by forming electrical connections to points on the surface of the IC die selected by the end-user, rather than the manufacturer of the IC package.

For these types of devices, it is necessary to package the IC die in such a way that the edges and wires of the IC die are protected, but the sensor array and/or test points on the surface or the IC die remain completely exposed. The packaging is usually accomplished using some kind of molding process. However, this process is made more difficult by the need to prevent molding flash from forming on the IC sensor and by the need to compensate for variation in die thickness and die tilt. The exposed IC sensor surface is brittle and must be handled carefully to prevent it from shattering during the manufacturing process and in the field.

Also, these sensors are generally integrated into a hand-held device, such as a mobile phone to check fingerprints, a portable glucose meter to check the composition of body fluids, or a web-cam to take a picture. The packaging of these sensors has to be very efficient, to make the sensor very adaptable for integration into a hand-held system using a conventional surface mount (soldering) process. The smallest possible package is the silicon sensor itself, without the packaging. However, this is not compatible with the surface mounting process. Standard packages, such as Dual-in-Line package (DIP) or Quad Flat Pack (QPF), increase the mounting areas because of their leads. Other packages, such as BGA, add an excessive amount of additional thickness to the sensor.

Therefore, there is a need in the art for improving the packaging of an IC sensor that contains at least a partially exposed integrated circuit die surface.

SUMMARY OF THE INVENTION

To address the above-discussed deficiencies of the prior art, it is a primary object of an advantageous embodiment of the present invention to provide an integrated circuit (IC) device comprising: 1) an integrated circuit (IC) die having a first surface, a second surface opposite the first surface, and sidewalls extending between the first surface and the second surface; 2) an integrated circuit (IC) package for supporting the IC die, wherein the IC package is attached to at least one of the sidewalls of the IC die such that at least a portion of the IC die first surface and at least a portion of the IC die second surface are exposed; and 3) at least one auxiliary component attached to at least one of the exposed portion of the IC die first surface and the exposed portion of the IC die second surface.

According to one embodiment of the present invention, the at least one auxiliary component comprises a first auxiliary component having an exposed circuit connection point on a first surface of the first auxiliary component that is attached to at an exposed circuit connection point on the IC die first surface.

According to another embodiment of the present invention, the at least one auxiliary component comprises a second auxiliary component having an exposed circuit connection point on a first surface of the second auxiliary component that is attached to at an exposed circuit connection point on the IC die second surface.

According to still another embodiment of the present invention, the at least one auxiliary component is removably attached to the at least one of the exposed portion of the IC die first surface and the exposed portion of the IC die second surface The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. In particular, a controller may comprise a data processor and an associated memory that stores instructions that may be executed by the data processor. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 11, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged integrated circuit device.

It should be noted that the sizes and thicknesses of objects in FIGS. 1–11 are not to scale. FIGS. 1–11 are primarily intended to show the relative positions of objects. Furthermore, the terms "upper surface" and "lower surface" are used for convenience with respect to the device positions shown in FIGS. 1–11. However, the terms "upper surface" and "lower surface" should not be construed as absolute terms so as to limit the scope of the present invention. Those skilled in the art will understand that the devices shown in FIGS. 1–11 may be inverted or tilted on one side, thereby altering the meaning of upper surface and lower surface. More generally, the terms "first surface" and "second surface" may be used to distinguish between opposing sides of an IC die, and IC package, or another device.

Furthermore, those skilled in the art will appreciate that, in accordance with the principles of the present invention, an auxiliary component may be attached not only to an integrated circuit die containing active components, but may also be attached to an entirely passive electrical component, such as a sensor. Therefore, for the purposes of defining the scope of the claims of the present application, terms such as "integrated circuit," "integrated circuit device," "integrated circuit die," "integrated circuit package" and the like are defined to include not only conventional integrated circuits, but also any electrical component upon which an auxiliary attachment component may be mounted.

Figure 1A:
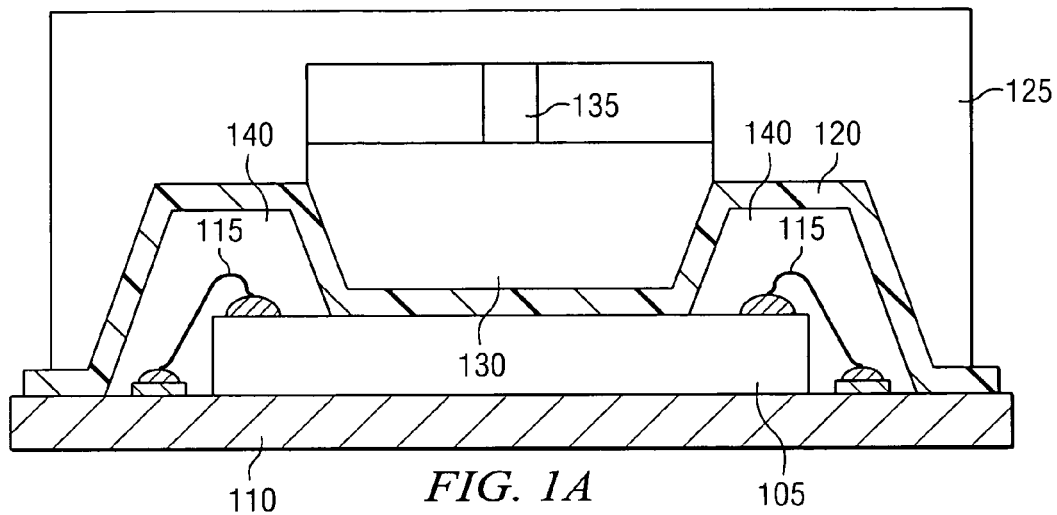
FIG. 1A is a cross-sectional view of an apparatus for fabricating an integrated circuit (IC) device according to the principles of the present invention.

FIG. 1A is a cross-sectional view of an apparatus for fabricating integrated circuit (IC) device 190 upon which an auxiliary attachment component according to the principles of the present invention may be mounted. IC device 190 comprises integrated circuit (IC) package 150, which supports and protects integrated circuit (IC) die 105. IC die 105 has exposed upper and lower surfaces according to the principles of the present invention. Conventional molding techniques may be used to fabricate IC package 150.

Initially, IC die 105 is temporarily mounted on carrier 110 using a low tack die attach compound or a suitable adhesive. Electrical connections, generally designated as item 115 in FIG. 1A, are added between contacts on the surface of IC die 105 and the surface of carrier 110. Electrical connections 115 are discussed below in greater detail.

Carrier 110 may be made from a variety of materials, including paper, polymer film, metal on printed circuit board (PCB), or the like. These materials may be coated with a low tack adhesive or film to facilitate temporary joining of the die and/or metal pads 320 illustrated in FIG. 3. Much of the surface area of carrier 110 exhibits low adhesion to the molding compound used to make the body of IC package 150 and to the die attach compound.

The body of IC package 150 is made by means of mold block 125, movable insert block 130 and spring 135. The lower surfaces of mold block 125 and movable block 130 are separated from the upper surfaces of IC die 105 and carrier 110 by soft film 120, which provides a layer of cushioning protection. Soft film 120 may initially be sealed against the lower surfaces of mold block 125 and movable block 130 by means of vacuum pressure.

Once soft film 120 is in place on the lower surfaces of mold block 125 and movable block 130, mold block 125 and movable block 130 are pressed down against IC die 105 and carrier 110, thereby forming cavity 140. Carrier 110 is supported on its lower surface by a bottom mold block (not shown) or other supporting surface (not shown). Soft film 120 forms a seal against the surfaces of IC die 105 and carrier 110, preventing the molding compound from leaking out of cavity 140 or from contacting the portion of the upper surface of IC die 105 that is to be left exposed.

Figure 1B:
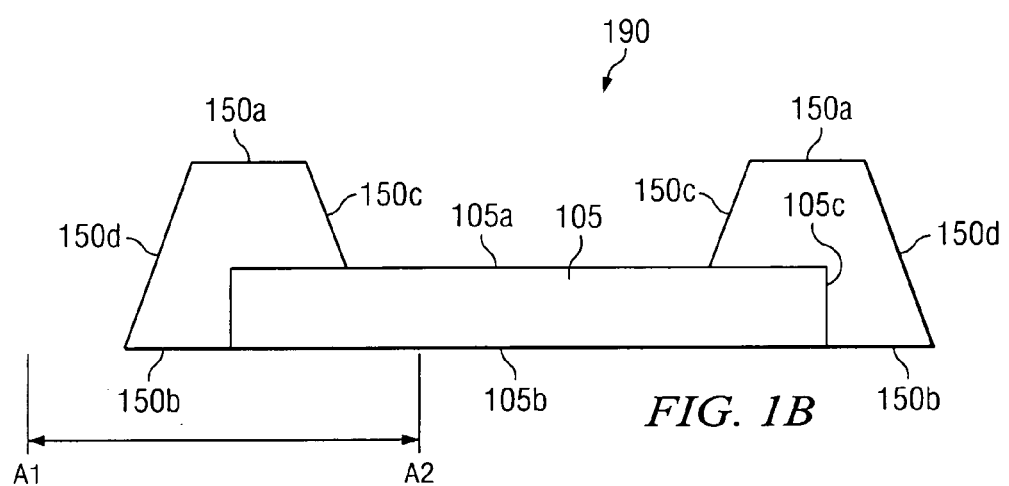
FIG. 1B is a cross-sectional view of the finished integrated circuit (IC) device fabricated by the apparatus illustrated in FIG. 1A above.

After the molding compound is injected into cavity 140 are allowed to harden, soft film 120, mold block 125, and movable block 130 are removed and carrier 110 is removed from the bottom surfaces of IC die 105 and IC package 150, thereby producing the final product. FIG. 1B is a cross-sectional view of finished integrated circuit (IC) device 190, fabricated by the apparatus and method described above in FIG. 1A. Electrical connections 115 within IC package 150 are omitted for the purpose of simplicity in explaining FIG. 1B.

As FIG. 1B illustrates, upper surface 105a and lower surface 105b of IC die 105 are now exposed. The molding compound that forms IC package 150 bonds to side surface 105c of IC die 105 and to the outer periphery (i.e., peripheral portion) of upper surface 105a of IC die 105. Lower surface 150b of IC package 150 lies in substantially the same plane as lower surface 105b of IC die 105. Inner sidewall 150c, outer sidewall 150d, and upper surface 150a of IC package 150 form a tub-like structure around upper surface 105a of IC die 105.

Figure 1C:
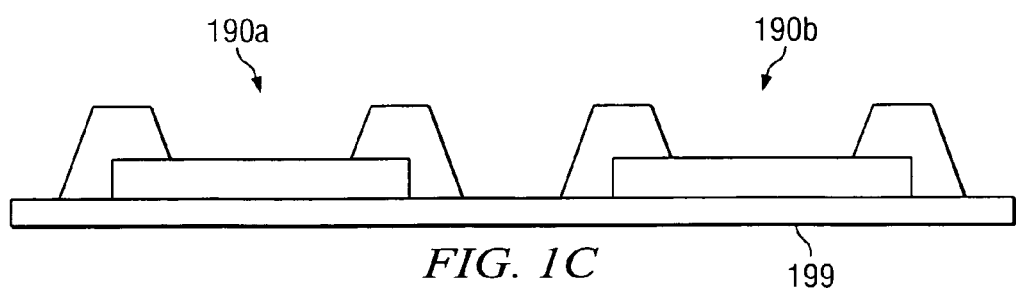
FIG. 1C is a side view of finished integrated circuit (IC) devices mounted on a printed circuit board (PCB)

FIG. 1C is a side view of finished integrated circuit (IC) devices 190a and 190b mounted on printed circuit board (PCB) 199. The reduced package thickness gives IC devices 190a and 190b a reduced profile. The package thickness may be reduced to the height of connection 115 to meet a low profile requirement. Additionally, the direct contact between lower surface 105b and the surface of PCB 199 provides superior heat dissipation and grounding.

Figure 2A:
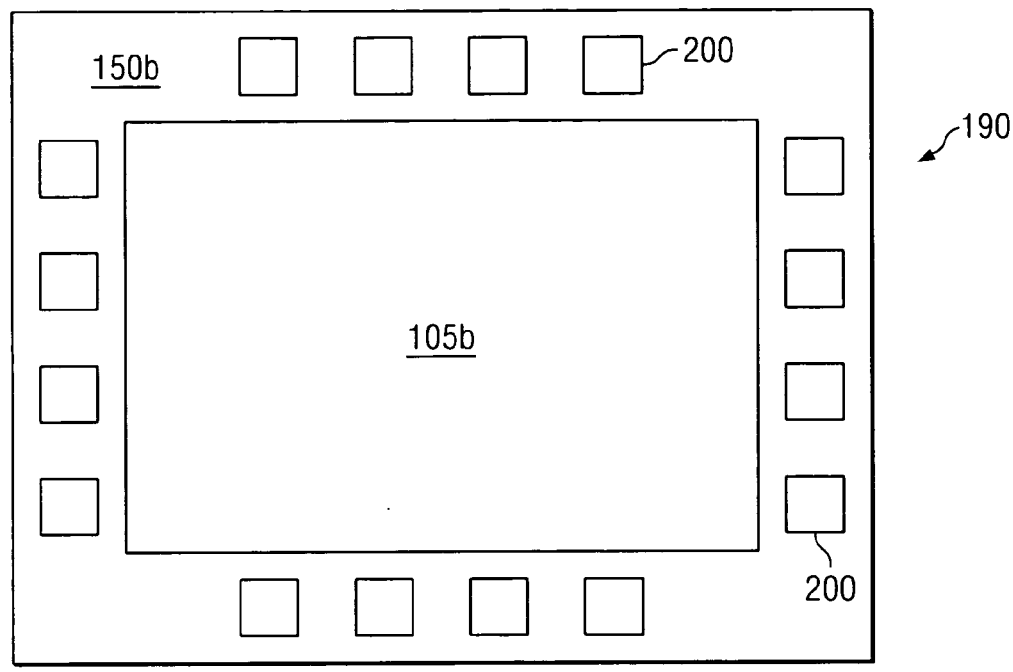
FIG. 2A is a bottom view of the finished integrated circuit (IC) device fabricated by the apparatus illustrated in FIG. 1A above.

FIG. 2A is a bottom view of finished integrated circuit (IC) device 190 fabricated by the apparatus illustrated in FIG. 1A above. Lower surfaces 200 of electrical connections 115 are visible at various points on lower surface 150b of IC package 150. All of lower surface 105b of IC die 105 is exposed.

Figure 2B:
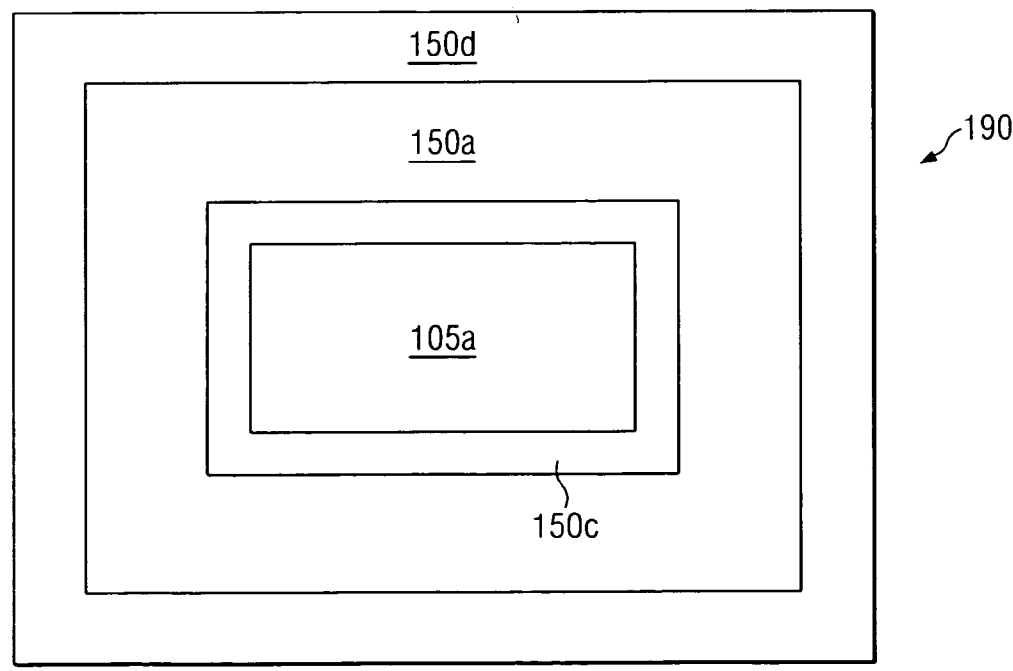
FIG. 2B is a top view of the finished integrated circuit (IC) device fabricated by the apparatus illustrated in FIG. 1A above.

FIG. 2B is a top view of finished integrated circuit (IC) device 190 fabricated by the apparatus illustrated in FIG. 1A above. Outer sidewall 150d, inner sidewall 150c, and upper surface 150a of IC package 150 are visible. Only a portion of upper surface 105a of IC die 105 is exposed.

Since upper surface 105a and lower surface 105b of IC die 105 are exposed, it is possible to use IC device 190 as, for example, an optical sensor if upper surface 105a or lower surface 105b contains light sensitive elements. Alternatively, IC device 190 may be used as a touch sensor if a touch array is disposed on upper surface 105a of IC die 105. Also, test points on upper surface 105a and lower surface 105b of IC die 105 now may be probed, or an end-user may connect additional wire leads to points on upper surface 105a and lower surface 105b of IC die 105.

Furthermore, a heat sink and/or a metal ground plane device may be attached directly to lower surface 105b of IC die 105. This is a particularly advantageous feature of the present invention. As shown in FIG. 1C, a large number of IC devices (e.g., 190a, 190b) constructed similarly to IC device 190 may be mounted directly on printed circuit board (PCB) 199, which contains exposed electrical contacts and thermal vias. Such a configuration would have a narrow profile and the IC devices could be tightly packed together.

Figure 3:
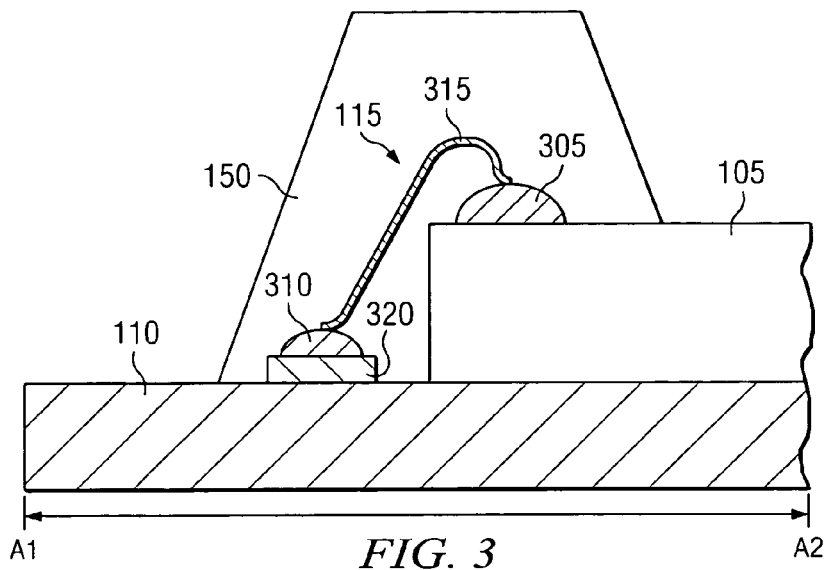
FIG. 3 is an enlarged cross-sectional view of an exemplary electrical connection in the integrated circuit (IC) package illustrated in FIG. 1B according to one embodiment of the present invention.

FIG. 3 is an enlarged cross-sectional view of exemplary electrical connection 115 in integrated circuit (IC) package 150 in FIG. 1B according to one embodiment of the present invention. The enlarged view extends from boundary A1 to boundary A2 in FIG. 1B. Carrier 110 is still in place.

Electrical connection 115 may use any conventional wire bonding technique to create a connection between a contact point on upper surface 105a of IC die 105 and an external contact pad on the lower surface 105b of IC package 150. In an exemplary embodiment, electrical connection 115 may use a stitch and ball technique to form metal ball 305, metal ball 310, and wire 315, to connect to pre-positioned metal pad 320. Metal pad 320 is temporarily affixed to carrier 110 by any known technique, including an applique applied to film, selective plating, and the like. When the mold compound is injected, the mold compound surrounds metal ball 305, metal ball 310, and wire 315 and locks them in placed when the mold compound hardens.

It is noted that metal pad 320 may either remain in place in IC package 150 when carrier 110 is removed or may be pulled out of IC package 150 when carrier 110 is removed. These two different configurations may be selected by controlling the relative strengths of the mechanical, chemical or metallurgical joining forces between:

1) metal pad 320 and the molding compound of IC package 150, and/or between metal pad 320 and ball 310; and
2) the interface between the lower surface of metal pad 320 and the upper surface of carrier 110.

Figure 4:
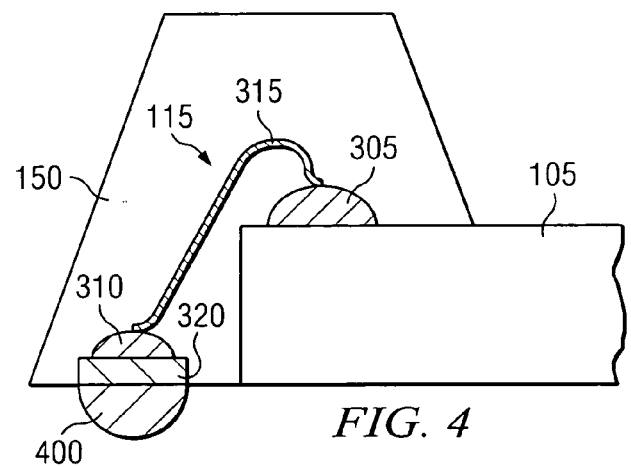
FIG. 4 is an enlarged cross-sectional view of an exemplary electrical connection in the integrated circuit (IC) package illustrated in FIG. 1B according to another embodiment of the present invention.

FIG. 4 is an enlarged cross-sectional view of exemplary electrical connection 115 within integrated circuit (IC) package 150 according to another embodiment of the present invention. If the interface between metal pad 320 and the molding compound of IC package 150 is stronger than the interface between the lower surface of metal pad 320 and the upper surface of carrier 110, metal pad 320 remains inside IC package 150 when carrier 110 is removed. The bottom surfaces of metal pads 320 then become the lower surfaces 200 shown in FIG. 2A. Conventional method can then be used to create solder ball 400 on the lower surface of metal pad 320.

The relative adhesion strength between these interfaces may be controlled by varying the wirebonding parameters (e.g., force, energy, and time), and by varying the type and amount of plating on metal pad 320, as is generally known in the art.

Figure 5:
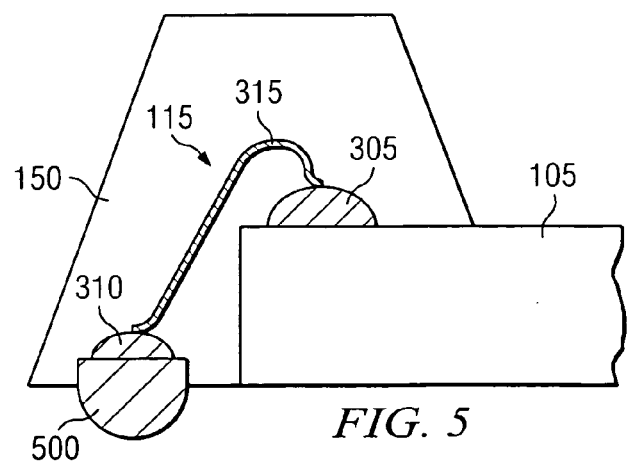
FIG. 5 is an enlarged cross-sectional view of an exemplary electrical connection in the integrated circuit (IC) package illustrated in FIG. 1B according to still another embodiment of the present invention.

FIG. 5 is an enlarged cross-sectional view of exemplary electrical connection 115 within integrated circuit (IC) package 150 according to still another embodiment of the present invention. If the interface between the lower surface of metal pad 320 and the upper surface of carrier 110 is stronger than the interface between metal pad 320 and the molding compound of IC package 150, metal pad 320 is pulled out of IC package 150 when carrier 100 is removed. This leaves an indentation in lower surface 150b of IC package 150. The lower surfaces of metal balls 310 then become the lower surfaces 200 shown in FIG. 2A. Conventional method can then be used to create solder ball 500 on the lower surface of metal pad 320.

Figure 6:
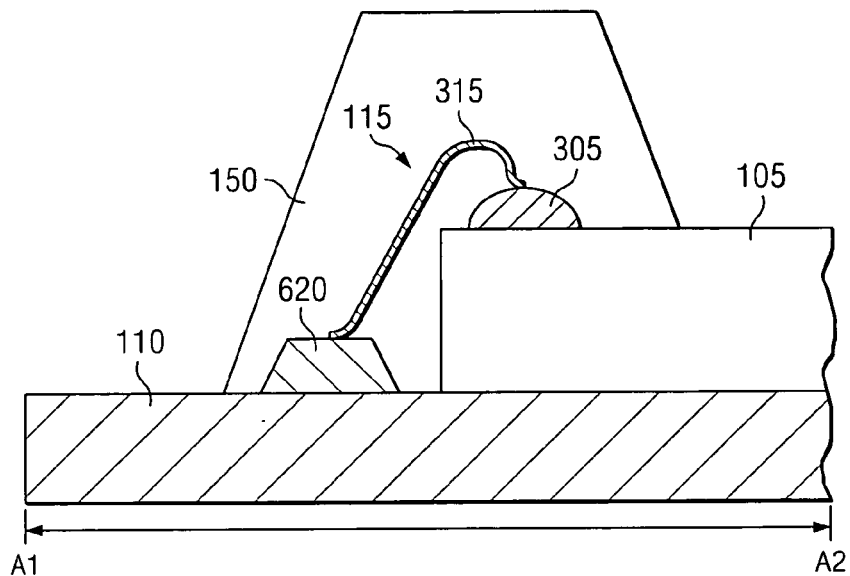
FIG. 6 is an enlarged cross-sectional view of an exemplary electrical connection in the integrated circuit (IC) package illustrated in FIG. 1B according to still another embodiment of the present invention.

FIG. 6 is an enlarged cross-sectional view of an exemplary electrical connection in the integrated circuit (IC) package illustrated in FIG. 1B according to still another embodiment of the present invention. FIG. 6 differs from FIG. 3 in that the shape of metal pad 320 has been modified and metal ball 310 has been omitted. Metal ball 310 is not strictly required, so wire 315 is bonded directly to the upper surface of metal pad 620. Metal pad 320 has been replaced by metal pad 620, which has a trapezoidal cross-sectional area. The trapezoidal cross-sectional area makes it easier for metal pad 620 to be pulled out of IC package 150 by carrier 110, if so desired.

Figure 7:
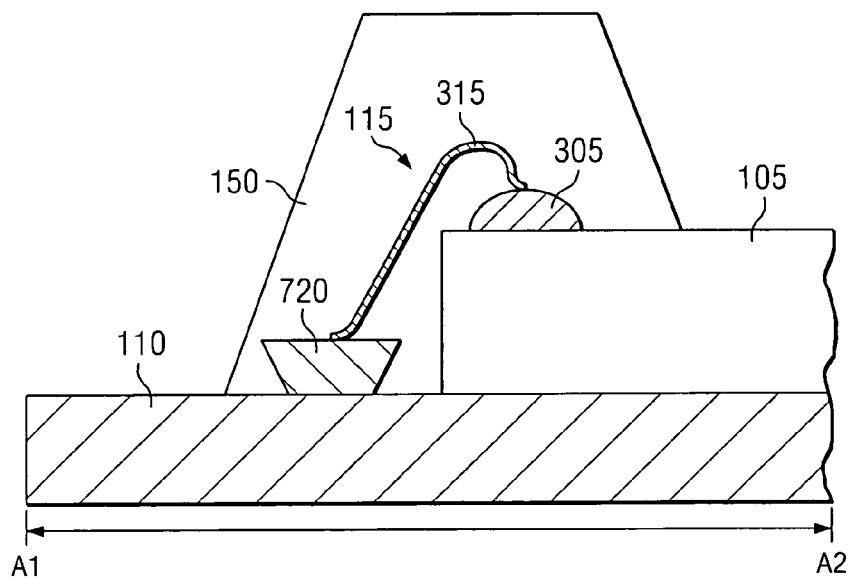
FIG. 7 is an enlarged cross-sectional view of an exemplary electrical connection in the integrated circuit (IC) package illustrated in FIG. 1B according to still another embodiment of the present invention.

FIG. 7 is an enlarged cross-sectional view of an exemplary electrical connection in the integrated circuit (IC) package illustrated in FIG. 1B according to still another embodiment of the present invention. FIG. 7 differs from FIG. 6 in that metal pad 720 has been inverted. Metal pad 720 has a trapezoidal cross-sectional area similar to metal pad 320. However, since the wider base of the trapezoid is now within IC package 150, the hardened molding compound prevents metal pad 720 from being pulled out when carrier 110 is removed.

Figure 8:
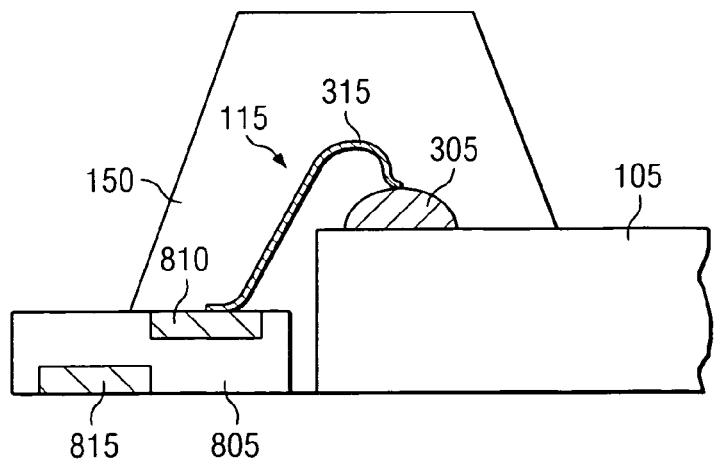
FIG. 8 is an enlarged cross-sectional view of an exemplary electrical connection within the integrated circuit (IC) package in FIG. 1B according to still another embodiment of the present invention.

FIG. 8 is an enlarged cross-sectional view of exemplary electrical connection 115 within integrated circuit (IC) package 150 according to still another embodiment of the present invention. In FIG. 8, intermediate substrate (or interposer) 805 is used to form electrical connections. Carrier 110 holds intermediate substrate 805 in place while wire 315 is jointed to contact pad 810 and during the molding process. After carrier 110 is removed, the lower surface of intermediate substrate 805 is exposed, including contact pad 815. The lower surface of intermediate substrate 805 lies in substantially the same plane as lower surface 105b of IC die 105.

Intermediate substrate 805 may be any one of several standard packaging designs, including organic laminate (PC board), polyimide tape, or ceramic. Internally, intermediate substrate 805 contains conductive paths (typical metal) on one or more conduction layers that connect contact pad 810 and contact pad 815 by through hole, metal vias, and the like. Contact pad 815 may receive a solder ball as explained above in FIG. 4.

Advantageously, the functionality and versatility of integrated circuit device 190 may be improved by mounting or attaching auxiliary components directly on exposed upper surface 105a or exposed lower surface 105b, or both, of IC die 105. For example, a second integrated circuit, such as a flip chip, may be attached to upper surface 105a (or lower surface 105b) by an array of solder balls. Similarly, another sensor element (e.g., capacitive chemical, micro-channel, and the like) may be attached to lower surface 105b (or upper surface 105a) by soldering or some other means. Thus, two integrated circuits may be stacked one on top of the other and electrical connections may be made directly between contact points on the exposed surfaces of each integrated circuit.

Figure 9:
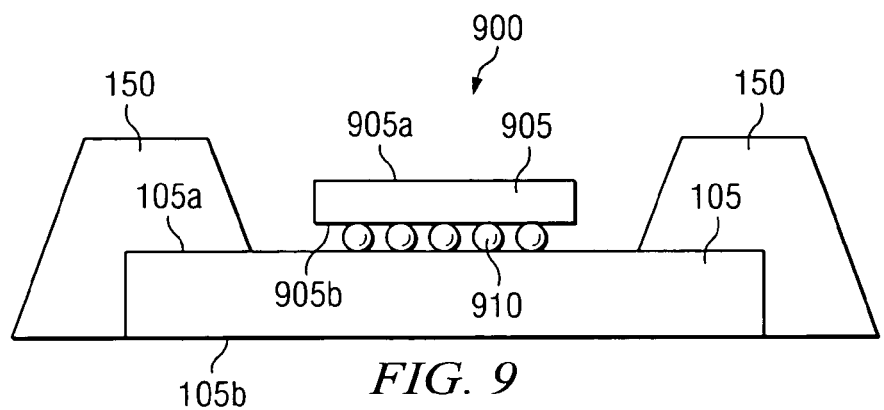
FIG. 9 is a cross-sectional view of the integrated circuit (IC) package illustrated in FIG. 1B with an auxiliary attachment component mounted on an upper surface of the IC package according to an exemplary embodiment of the present invention.

FIG. 9 is a cross-sectional view of integrated circuit device 900, which comprises IC die 105 and IC package 150 with auxiliary component 905 mounted on upper surface 105a of IC die 105 according to an exemplary embodiment of the present invention. Auxiliary component 905 comprises upper surface 905a and lower surface 905b. According to a first exemplary embodiment of the present invention, auxiliary component 905 may be, for example, an integrated circuit die having exposed test points on upper surface 905a and exposed circuit connection points on lower surface 905b. According to an alternate embodiment of the present invention, auxiliary component 905 may be a sensor element (e.g., capacitive chemical, micro-channel, etc.).

Auxiliary component 905 is attached to IC die 105 by means of solder balls 910. Each solder ball 910 connects an exposed circuit connection point on lower surface 905b of auxiliary component 905 to a corresponding exposed circuit connection point on upper surface 105a of IC die 105. Thus, two integrated circuits, IC die 105 and auxiliary component 905, can be electrically coupled without the need for wires.

In addition to solder used in the form of solder balls, other means of connection are also possible. For example, conductive epoxy, Z-axis polymers and adhesives, chemically activated co-valent bonding, metal-to-metal diffusion bonding, and welding and all commercially available bonding processes. These bonding methods of choice serve as means for coupling the die to the auxiliary component.

Figure 10:
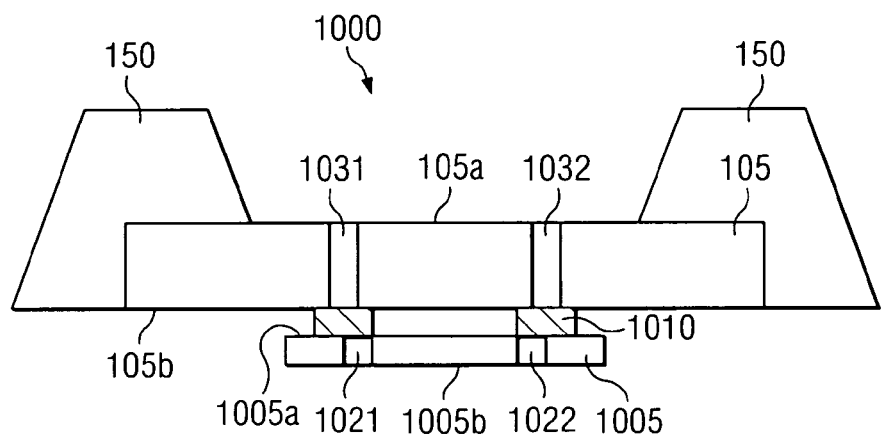
FIG. 10 is a cross-sectional view of the integrated circuit (IC) package illustrated in FIG. 1B with an auxiliary attachment component mounted on a lower surface of the IC package according to an exemplary embodiment of the present invention.

FIG. 10 is a cross-sectional view of integrated circuit device 1000, which comprises IC die 105 and IC package 150 with auxiliary component 1005 mounted on lower surface 105b of IC die 105 according to an exemplary embodiment of the present invention. Auxiliary component 1005 comprises upper surface 1005a and lower surface 1005b. According to a first exemplary embodiment of the present invention, auxiliary component 1005 may be, for example, an integrated circuit die having exposed test points on lower surface 1005b and exposed circuit connection points on upper surface 1005b. According to an alternate embodiment of the present invention, auxiliary component 1005 may be a sensor element (e.g., capacitive, chemical, micro-channel, etc.).

In the illustrated embodiment, IC die 105 has a plurality of vias, such as exemplary vias 1031 and 1032, passing through the silicon of IC die 105. Similarly, auxiliary component 1005 has a plurality of vias, such as exemplary vias 1021 and 1022, passing through the body (silicon or other material) of auxiliary component 1005. Auxiliary component 1005 is attached to IC die 105 by means of raised metal contact pad 1010. Each metal contact pad 1010 connects an exposed circuit connection point on upper surface 1005a of auxiliary component 1005 to a corresponding exposed circuit connection point on lower surface 105b of IC die 105.

Those skilled in the art will understand that in an alternate embodiment of the present invention, auxiliary component 905 and auxiliary component 1005 may both be attached to opposite sides of IC die 105 at the same time. Also, the means of attachment may readily be modified so that either or both of auxiliary component 905 and auxiliary component 1005 may be removably attached, rather than permanently attached, to IC die 105.

Figure 11:
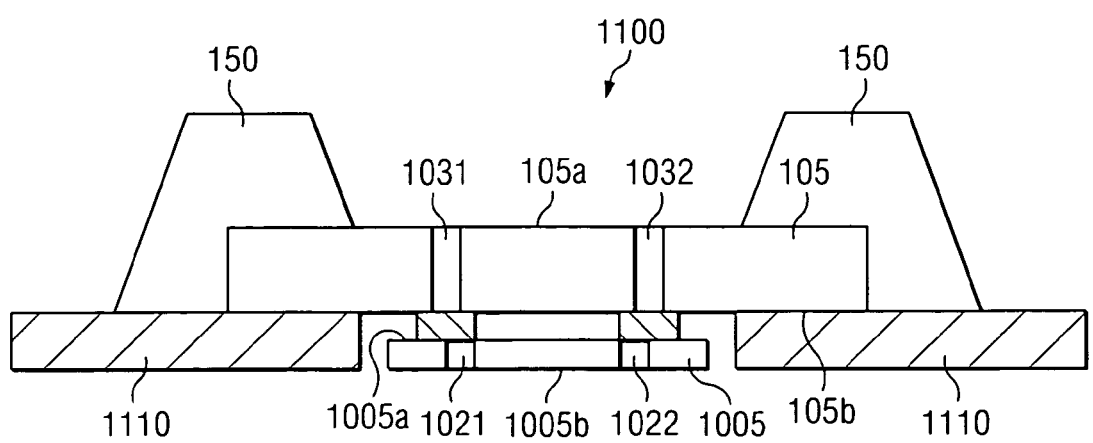
FIG. 11 is a cross-sectional view of the integrated circuit (IC) package and auxiliary attachment component illustrated in FIG. 10 mounted on a printed circuit board with a cut-out for accommodating the auxiliary attachment component.

FIG. 11 is a cross-sectional view of integrated circuit assembly 1100, which comprises IC die 105, IC package 150, and auxiliary component 1005 as illustrated in FIG. 10, mounted on printed circuit board (PCB) 1110. An opening in printed circuit board 1110 is made to provide access to auxiliary component 1005 mounted on the lower surface of integrated circuit die 105. The lower surface of printed circuit board 1110 can be made in the same plane as the lower surface of auxiliary component 1005 in order to maintain a planar surface.

As noted above, an auxiliary component may be attached not only to an integrated circuit die containing active components, but may also be attached to an entirely passive electrical component, such as a sensor. Thus, the auxiliary component may be an active integrated circuit, a prepackaged IC (such as a Quad Flat No-lead package), or a passive component, such as a resistor or a capacitor array. Furthermore, integrated circuit die 105 may be a sensor array and the auxiliary component may be an active integrated circuit.

Although the present invention has been described in detail, those skilled in the art should understand that they can make various changes, substitutions and alterations herein without departing from the spirit and scope of the invention in its broadest form.

What is claimed is:

1. An integrated circuit (IC) device comprising:
   an integrated circuit (IC) die having a first surface, a second surface opposite said first surface, and sidewalls extending between said first surface and said second surface;
   an integrated circuit (IC) package for supporting said IC die, wherein said IC package is attached to at least one of said sidewalls of said IC die such that at least a portion of said IC die first surface and at least a portion of said IC die second surface are exposed; and
   at least one auxiliary component attached to said exposed portion of said IC die first surface or said exposed portion of said IC die second surface.

2. The integrated circuit (IC) device as set forth in claim 1 wherein said IC package has a first surface and a second surface opposite said IC package first surface, and wherein said IC package second surface lies in substantially a same plane as said IC die second surface.

3. The integrated circuit (IC) device as set forth in claim 2 wherein a first portion of said IC package is attached to and covers at least part of a peripheral portion of said IC die first surface.

4. The integrated circuit (IC) device as set forth in claim 3 wherein said IC package encases at least one electrical connection extending between a contact pad on said peripheral portion of said IC die first surface and a contact pad disposed on said IC package second surface.

5. The integrated circuit (IC) device as set forth in claim 4 wherein an exposed surface of said contact pad disposed on said IC package second surface lies in substantially a same plane as said IC die second surface.

6. The integrated circuit (IC) device as set forth in claim 5 wherein an exposed surface of said contact pad disposed on said IC package second surface is recessed in an indentation in said IC package second surface.

7. The integrated circuit (IC) device as set forth in claim 1 wherein substantially all of said IC die second surface is exposed.

8. The integrated circuit (IC) device as set forth in claim 1 wherein said at least one auxiliary component comprises a first auxiliary component having an exposed circuit connection point on a firs: surface of said first auxiliary component that is attached to at an exposed circuit connection point on said IC die first surface.

9. The integrated circuit (IC) device as set forth in claim 8 wherein said at least one auxiliary component comprises a second auxiliary component having an exposed circuit connection point on a first surface of said second auxiliary component that is attached to at an exposed circuit connection point on said IC die second surface.

10. The integrated circuit (IC) device as set forth in claim 1 wherein said at least one auxiliary component is removably attached to said at least one of said exposed portion of said IC die first surface and said exposed portion of said IC die second surface.

11. An electrical assembly comprising:
    a printed circuit board having a plurality of integrated circuit (IC) devices disposed on a first surface of said printed circuit board, at least one of said IC devices comprising:
    an integrated circuit (IC) die having a first surface, a second surface, opposite said first surface, and sidewalls extending between said first surface and said second surface;
    an integrated circuit (IC) package for supporting said IC die, wherein said IC package is attached to at least one of said sidewalls of said IC die such that at least a portion of said IC die first surface and at least a portion of said IC die second surface are exposed; and
    at least one auxiliary component attached to said exposed portion of said IC die first surface or said exposed portion of said IC die second surface.

12. The electrical assembly as set forth in claim 11 wherein said IC package has a first surface and a second surface opposite said IC package first surface, and wherein said IC package second surface lies in substantially the same plane as said IC die second surface.

13. The electrical assembly as set forth in claim 12 wherein a first portion of said IC package is attached to and covers at least part of a peripheral portion of said IC die first surface.

14. The electrical assembly as set forth in claim 13 wherein said IC package encases at least one electrical connection extending between a contact pad on said peripheral portion of said IC die first surface and a contact pad disposed on said IC package second surface.

15. The electrical assembly us set forth in claim 14 wherein an exposed surface of said contact pad disposed on said IC package second surface lies in substantially the same plane as said IC die second surface.

16. The electrical assembly as set forth in claim 15 wherein an exposed surface of said contact pad disposed on said IC package second surface is recessed in an indentation in said IC package second surface.

17. The electrical assembly as set forth in claim 11 wherein substantially all of said IC die second surface is exposed.

18. The electrical assembly as set forth in claim 11 wherein said at least one auxiliary component comprises a first auxiliary component having an exposed circuit connection point on a first surface of said first auxiliary component that is attached to at an exposed circuit connection point on said IC die first surface.

19. The electrical assembly as set forth in claim 18 wherein said at least one auxiliary component comprises a second auxiliary component having an exposed circuit connection point on a first surface of said second auxiliary component that is attached to at an exposed circuit connection point on said IC die second surface.

20. The electrical assembly as set forth in claim 11 wherein said at least one auxiliary component is removably attached to said at least one of said exposed portion of said IC die first surface and said exposed portion of said IC die second surface.

21. An integrated circuit (IC) device comprising:
an integrated circuit (IC) die having a first surface, a second surface, oppposite said first surface, and sidewalls extending between said first surface and said second surface;
an intermediate substrate having a first surface, a second surface opposite said first surface, and sidewalls extending between said first surface and said second surface, wherein said intermediate substrate second surface lies in substantially the same plane as said IC die second surface;
an integrated circuit (IC) package for supporting said IC die and said intermediate substrate, wherein said IC package is attached to at least one IC die sidewall and at least one intermediate substrate sidewall, such that at least a portion of said IC die first surface and at least a portion of said IC die second surface are exposed and at least a portion of said intermediate substrate second surface is exposed; and
at least one auxiliary component attached to at least one of said exposed portion of said IC die first surface and said exposed portion of said IC die second surface.

22. The integrated circuit (IC) device as set forth in claim 21 wherein said IC package has a first surface and a second surface opposite said IC package first surface, and wherein said IC package second surface lies in substantially the same plane as said IC die second surface.

23. The integrated circuit (IC) device as set forth in claim 22 wherein a first portion of said IC package is attached to and covers at least part of a peripheral portion of said IC die first surface.

24. The integrated circuit (IC) device as set forth in claim 23 wherein said IC package encases at least one electrical connection extending between a contact pad on said peripheral portion of said IC die first surface and a contact pad disposed on said intermediate substrate second surface.

25. The integrated circuit (IC) device as set forth in claim 24 wherein an exposed surface of said contact pad disposed on said intermediate substrate second surface lies in substantially the same plane as said IC die second surface.

26. The integrated circuit (IC) device as set forth in claim 25 wherein an exposed surface of said contact pad disposed on said intermediate substrate second surface is recessed in an indentation in said IC die second surface.

27. The integrated circuit (IC) device as set forth in claim 21 wherein substantially all of said IC die second surface is exposed.

28. The integrated circuit (IC) device as set forth in claim 21 wherein said at least one auxiliary component comprises a first auxiliary component having an exposed circuit connection point on a first surface of said first auxiliary component that is attached to at an exposed circuit connection point on said IC die first surface.

29. The integrated circuit (IC) device as set forth in claim 28 wherein said at least one auxiliary component comprises a second auxiliary component having an exposed circuit connection point on a first surface of said second auxiliary component that is attached to at an exposed circuit connection point on said IC die second surface.

30. The integrated circuit (IC) device as set forth in claim 21 wherein said at least one auxiliary component is removably attached to said at least one of said exposed portion of said IC die first surface and said exposed portion of said IC die second surface.

* * * * *